United States Patent
Chen et al.

(10) Patent No.: US 10,308,806 B2
(45) Date of Patent: Jun. 4, 2019

(54) RESIN COMPOSITION AND USES THEREOF IN HIGH FREQUENCY CIRCUIT BOARDS

(71) Applicant: SHENGYI TECHNOLOGY CO., LTD., Dongguan (CN)

(72) Inventors: Guangbing Chen, Dongguan (CN); Xianping Zeng, Dongguan (CN)

(73) Assignee: SHENGYI TECHNOLOGY CO., LTD. (CN)

( * ) Notice: Subject to any disclaimer, the term of this patent is extended or adjusted under 35 U.S.C. 154(b) by 411 days.

(21) Appl. No.: 15/027,365

(22) PCT Filed: Aug. 11, 2014

(86) PCT No.: PCT/CN2014/084109
§ 371 (c)(1),
(2) Date: Apr. 5, 2016

(87) PCT Pub. No.: WO2015/169002
PCT Pub. Date: Nov. 12, 2015

(65) Prior Publication Data
US 2016/0244610 A1    Aug. 25, 2016

(30) Foreign Application Priority Data
May 6, 2014    (CN) .......................... 2014 1 0189149

(51) Int. Cl.
| C08L 71/12 | (2006.01) |
| B32B 15/08 | (2006.01) |
| B32B 27/04 | (2006.01) |
| C08J 5/24 | (2006.01) |
| H05K 1/03 | (2006.01) |
| C09D 171/12 | (2006.01) |

(52) U.S. Cl.
CPC ............ *C08L 71/126* (2013.01); *B32B 15/08* (2013.01); *B32B 27/04* (2013.01); *C08J 5/24* (2013.01); *C08L 71/12* (2013.01); *C09D 171/12* (2013.01); *H05K 1/03* (2013.01); *H05K 1/038* (2013.01); *C08J 2371/12* (2013.01); *C08J 2483/04* (2013.01)

(58) Field of Classification Search
CPC ................................ C08L 71/12; C08G 77/70
See application file for complete search history.

(56) References Cited

U.S. PATENT DOCUMENTS 5,242,744 A * 9/1993 Schryer .................. C08K 3/22
                                                      442/414
5,916,952 A    6/1999 Romenesko et al.

FOREIGN PATENT DOCUMENTS

| CN | 1231307 A | 10/1999 |
| CN | 101370866 A | 2/2009 |
| CN | 102161823 A | 8/2011 |
| CN | 102304264 A | 1/2012 |
| CN | 102993683 A | 3/2013 |
| CN | 103122137 A | 5/2013 |
| GB | 2282819 A | 4/1995 |
| JP | H02115263 A | 4/1990 |
| JP | 2003012820 A | 1/2003 |
| KR | 100569235 B1 | 1/2005 |

OTHER PUBLICATIONS

ISA/CN, International Search Report and Written Opinion prepared for PCT/CN2014/084109 dated Feb. 17, 2015.
Extended European Search Report for Application 14891459, dated Jun. 23, 2016, 5 pgs., European Patent Office, Germany.

* cited by examiner

*Primary Examiner* — Kuo Liang Peng
(74) *Attorney, Agent, or Firm* — McDonald Hopkins LLC

(57) ABSTRACT

The present invention discloses a resin composition, comprising an unsaturated thermosetting modified polyphenylether resin and an MQ organosilicon resin containing unsaturated double bonds and having a three-dimensional network structure and hydrolytically condensed from monofunctional siloxane unit (M unit) and tetrafunctional silica unit (Q unit). The present invention further discloses a high-frequency circuit substrate prepared from the aforesaid resin composition and the uses of the aforesaid resin composition in the art. The high frequency circuit substrate of the present invention has a high glass transition temperature, a high thermal decomposition temperature, a high interstratified adhesive force, a low dielectric constant and a low dielectric loss tangent, and are very suitable as the circuit substrates of high frequency electronic equipments.

20 Claims, 1 Drawing Sheet

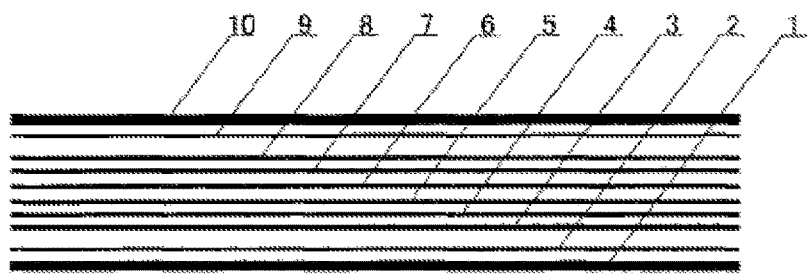

RESIN COMPOSITION AND USES THEREOF IN HIGH FREQUENCY CIRCUIT BOARDS

CROSS REFERENCE TO RELATED APPLICATIONS

This application is a 35 U.S.C. 371 national stage filing and claims priority to International Application No. PCT/CN2014/084109 filed on Aug. 11, 2014, entitled "A RESIN COMPOSITION AND USES THEREOF IN HIGH FREQUENCY CIRCUIT BOARDS," which claims the benefit of Chinese Patent Application No. 201410189149.9 filed on May 6, 2014 each of which is incorporated herein in its entirety by reference.

BRIEF SUMMARY OF THE INVENTION

The present invention relates to a resin composition, specifically a resin composition and uses thereof in high frequency circuit substrates.

BACKGROUND OF THE INVENTION

With the development of electronic information technology, the miniaturization and densification of electronic equipment installation, the high capacity and high frequency of information, in recent years, higher demands are put forward for the overall performances of circuit substrates, such as thermal resistance, water absorption, chemical resistance, mechanical property, size stability, and dielectric properties.

As to the dielectric properties, the transmission rate of signals and the dielectric constant Dk of insulating materials in high frequency circuits have the following relation, i.e., the lower the dielectric constant Dk of insulating materials is, the faster the transmission rate of signals is. Thus, substrates having low dielectric constant need to be developed to achieve high speed of the transmission rate of signals. Along with high frequency of the signal frequency, the signal loss in the substrates cannot be ignored. The signal loss and frequency, dielectric constant Dk, dielectric loss factor Df have the following relation, i.e., the lower the dielectric constant Dk of the substrates and the dielectric loss factor Df are, the lower the signal loss is. Therefore it has become a common research direction for CCL manufacturers to develop high frequency circuit substrates having low dielectric constant Dk and low dielectric loss factor Df and having better thermal resistance.

In the molecular structure of polyphenylether resin, there are a large amount of benzene ring structures and there is no strong polar group, which gives polyphenylether resin with excellent properties, e.g., high glass transition temperature, better size stability, low linear expansion coefficient, low water absorption, especially excellent low dielectric constant, and low dielectric loss. However, polyphenylether as a thermoplastic resin has the shortcomings of high resin melting point, worse processing performance, worse solvent resistance and the like. Excellent physical properties, thermal resistance, chemical properties and electrical properties of polyphenylether attract the world's major companies to make modifications and certain achievements have been made. For example, active groups are introduced to the chain ends or side chains of polyphenylether molecules to make them become a thermosetting resin. After thermosetting, the resin has excellent overall properties, such as thermal resistance and dielectric properties, and it becomes an ideal material for preparing high frequency circuit substrates.

The curable modified polyphenylether resin having active groups at the end of the molecular chain or at the side chain is generally applied in high frequency circuit substrates in combination with crosslinking agent to compose a resin composition. The crosslinking agent has active groups capable of reacting with the modified polyphenylether. According to the document research, the common crosslinking agents are polybutadiene, butadiene styrol copolymer and the like for modified polyphenylether having C=C double bonds. For example, CN101370866A, CN102161823, and CN102304264 disclose using polybutadiene or butadiene styrol copolymer as the crosslinking agent for modified polyphenylether to prepare high frequency circuit substrates. Although the boards have excellent overall properties, such as dielectric properties, polybutadiene or butadiene styrol copolymer decreases the thermal resistance and interstratified adhesive force of the boards.

Using organosilicon compounds containing unsaturated double bonds as the crosslinking agent for modified polyphenylether can solve the problems of insufficient thermal resistance and interstratified adhesive force of the boards brought by polybutadiene or butadiene styrol copolymer as the polyphenylether crosslinking agent. CN102993683 discloses preparing the crosslinking agent for modified polyphenylether by using organosilicon compounds containing unsaturated double bonds. The high frequency circuit substrates prepared therefrom have a high glass transition temperature, a high thermal decomposition temperature, a high interstratified adhesive force, a low dielectric constant and a low dielectric loss tangent, and are very suitable as the circuit substrates for high frequency electronic equipments.

CN102993683 discloses that organosilicon compounds containing unsaturated double bonds used therein are linear or annular organosilicon compounds. Linear organosilicon compounds containing unsaturated double bonds have a better flexibility, and the high frequency circuit substrates prepared therefrom have a lower bending strength. The circuit substrates prepared from annular organosilicon compounds containing unsaturated double bonds have better overall properties, but the organosilicon compounds easily evaporate due to low molecular weight.

DETAILED DESCRIPTION OF THE INVENTION

As to the problems in the prior art, one objective of the present invention is to provide a resin composition having a low dielectric constant Dk and a low dielectric loss factor Df, and excellent thermal resistance and interstratified adhesive force, so as to meet the requirements of high frequency circuit substrates on dielectric properties, thermal resistance and interstratified adhesive force, and also be able to be used for preparing high frequency circuit substrates.

In order to achieve the objective above, the present invention discloses the following technical solution:
a resin composition comprising a modified polyphenylether resin and an MQ organosilicon resin containing unsaturated double bonds and having a three-dimensional network structure and hydrolytically condensed from monofunctional siloxane unit (M unit) and tetrafunctional silica unit (Q unit).

The modified polyphenylether resin is a solid thermosetting resin in powder form at room temperature, and has active unsaturated double bonds at both ends. In the presence of a curing initiator, radical polymerization curing may be carried out in the resin to obtain a thermosetting resin having excellent overall properties, such as thermal resistance, size stability, low water absorption, and dielectric properties.

The MQ organosilicon resin containing unsaturated double bonds and having a three-dimensional network structure and hydrolytically condensed from a monofunctional siloxane unit (M unit) and tetrafunctional silica unit (Q unit) is used as the crosslinking agent for the modified polyphenylether. After curing, the resin composition has a great crosslinking density and may provide a high glass transition temperature for high frequency circuit substrates. Moreover, the MQ organosilicon resin containing unsaturated double bonds and having a three-dimensional network structure and hydrolytically condensed from monofunctional siloxane unit (M unit) and tetrafunctional silica unit (Q unit) contains no polar groups, which can ensure a low water absorption and excellent dielectric properties of high frequency circuit substrates. The MQ organosilicon resin containing unsaturated double bonds and having a three-dimensional network structure and hydrolytically condensed from monofunctional siloxane unit (M unit) and tetrafunctional silica unit (Q unit) has a high thermal decomposition temperature, so as to provide high frequency circuit substrates with excellent thermal resistance. In addition, the prepared high frequency circuit substrates have high interstratified adhesive force and bending strength, which may increase the reliability of the substrates.

The modified polyphenylether resin has excellent properties, such as low dielectric constant and low dielectric loss tangent. By using the MQ organosilicon resin containing unsaturated double bonds and having a three-dimensional network structure and hydrolytically condensed from monofunctional siloxane unit (M unit) and tetrafunctional silica unit (Q unit) as the crosslinking agent for the modified polyphenylether resin, the prepared high frequency circuit substrates have better overall properties, such as dielectric properties, water absorption, thermal resistance, interstratified adhesive force, bending strength and the like. As compared with polybutadiene and butylbenzene copolymer as the crosslinking agent, the substrates have higher thermal resistance and interstratified adhesive force. As compared with linear organosilicon compounds containing unsaturated double bonds as the crosslinking agent, the substrates have a higher bending strength. As compared with annular organosilicon compounds containing unsaturated double bonds, the MQ organosilicon resin containing unsaturated double bonds and having a three-dimensional network structure and hydrolytically condensed from monofunctional siloxane unit (M unit) and tetrafunctional silica unit (Q unit) will not evaporate during the coating and drying.

Preferably, the modified polyphenylether resin has the following structure:

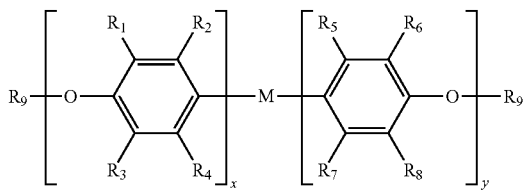

wherein $1 \leq x \leq 100$; $1 \leq y \leq 100$; $2 \leq x+y \leq 100$; the examples are $15 < x+y < 30$; $25 < x+y < 40$; $30 < x+y < 55$; $60 < x+y < 85$; $80 < x+y < 98$, etc.

M is selected from the group consisting of:

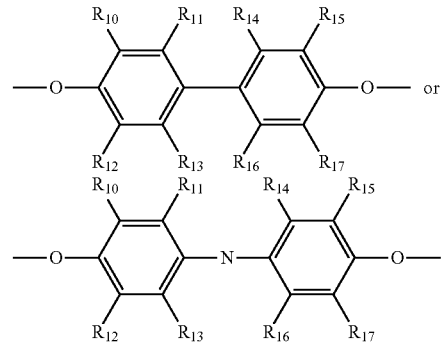

wherein N is any one selected from the group consisting of —O—, —CO—, SO, —SC—, —SO$_2$— and —C(CH$_3$)$_2$—.

$R_2$, $R_4$, $R_6$, $R_8$, $R_{11}$, $R_{13}$, $R_{15}$ and $R_{17}$ are all any one independently selected from the group consisting of substituted or unsubstituted C1-C8 linear chain alkyl group, substituted or unsubstituted C1-C8 branched chain alkyl group and substituted or unsubstituted phenyl.

$R_1$, $R_3$, $R_5$, $R_7$, $R_{10}$, $R_{12}$, $R_{14}$ and $R_{16}$ are all independently selected from the group consisting of: a hydrogen atom, substituted or unsubstituted C1-C8 linear chain alkyl group, substituted or unsubstituted C1-C8 branched chain alkyl groups and substituted or unsubstituted phenyl.

$R_9$ is selected from the group consisting of:

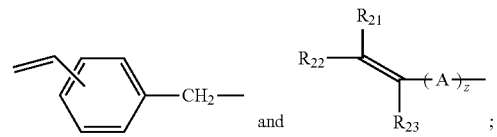

wherein A is selected from the group consisting of: arylene, carbonyl, or alkylene having 1-10 carbon atoms; Z is an integer from 0-10; and $R_{21}$, $R_{22}$ and $R_{23}$ are all independently selected from: a hydrogen atom or an alkyl having 1-10 carbon atoms.

Preferably, the modified polyphenylether resin has a number-average molecular weight of 500-10,000 g/mol, preferably 800-8,000 g/mol, and more preferably 1,000-7,000 g/mol.

One non-limitative example of the methacrylate-modified polyphenylether resin is SA9000.

The MQ organosilicon resin containing unsaturated double bonds and having a three-dimensional network structure and hydrolytically condensed from monofunctional siloxane unit (M unit) and tetrafunctional silica unit (Q unit) has a high unsaturated double bond content, and may form a high-density crosslinked spatial three-dimensional network structure after curing, has a high glass transition temperature, contains no polar groups, and has excellent dielectric properties. The MQ organosilicon resin containing unsaturated double bonds and having a three-dimensional network structure and hydrolytically condensed from monofunctional siloxane unit (M unit) and tetrafunctional silica unit (Q unit) contains Si—O bond in the molecular structure, has a high thermal decomposition temperature and can increase the thermal resistance of the cured products in the resin mixed system.

Preferably, the MQ organosilicon resin containing unsaturated double bonds and having a three-dimensional network structure and hydrolytically condensed from monofunctional siloxane unit (M unit) and tetrafunctional silica unit (Q unit) has the following general formula $$(Z_1Z_2Z_3SiO_{1/2})_x(SiO_{4/2})_y$$

wherein $1 \leq x \leq 100$; $1 \leq y \leq 100$; $2 \leq x+y \leq 200$; and $0.01 \leq x/y \leq 10$; at least one of $Z_1$, $Z_2$ and $Z_3$ is a group containing unsaturated double bond, and the other two are independently selected from the group consisting of substituted or unsubstituted C1-C8 linear chain alkyl group, substituted or unsubstituted C1-C8 branched chain alkyl group and substituted or unsubstituted phenyl.

One non-limitingexample of the MQ organosilicon resin is DT-2020 (Guangzhou Deerta Organosilicon Technology Development Co., Ltd). $Z_1$, $Z_2$ and $Z_3$ in DT-2020 are respectively vinyl, methyl, and methyl.

In order to increase the compatibility and crosslinking density of the MQ organosilicon resin and thermosetting modified polyphenylether resin, MQ organosilicon resins SY-1 and SY-2 different from DT-2020 are synthesized. $Z_1$, $Z_2$ and $Z_3$ in SY-1 are respectively vinyl, vinyl, and vinyl. $Z_1$, $Z_2$ and $Z_3$ in SY-2 are respectively vinyl, phenyl, and phenyl.

Based on 100 parts by weight of the modified polyphenylether resin, the MQ organosilicon resin containing unsaturated double bonds and having a three-dimensional network structure and hydrolytically condensed from monofunctional siloxane unit (M unit) and tetrafunctional silica unit (Q unit) is in an amount of from 10 to 100 parts by weight.

Preferably, the resin composition of the present invention further comprises a radical initiator functioning as initiating the polymerization and crosslinking and curing the resin system. Under heating conditions, the radical initiator decomposes to produce free radicals to initiate reaction and crosslinking of active groups in the resin system, so as to form a cross-linked network structure having a spatial three-dimensional structure.

The radical initiator is selected from organic peroxide initiator, further preferably from one or a mixture of at least two from the group consisting of dicumyl peroxide, dibenzoyl peroxide, tert-butyl peroxybenzoate, and n-butyl 4,4-bis(tert-butyl peroxy)valerate. The mixture is selected from a group, for example, a mixture of n-butyl 4,4-bis(tert-butyl peroxy)valerate and tert-butyl peroxybenzoate, a mixture of dibenzoyl peroxide and dicumyl peroxide, a mixture of n-butyl 4,4-bis(tert-butyl peroxy)valerate and dibenzoyl peroxide, a mixture tert-butyl peroxybenzoate and dicumyl peroxide, a mixture of n-butyl 4,4-bis(tert-butyl peroxy) valerate, tert-butyl peroxybenzoate and dibenzoyl peroxide. The radical initiators can be used separately or in combination. The initiators used in combination can achieve better synergistic effects.

Preferably, the resin composition of the present invention further comprises a flame retardant. Preferably, the flame retardant is one or a mixture of at least two selected from the group consisting of halogen-based flame retardant, phosphorus-based flame retardant or nitrogen-based flame retardant. More preferably, the flame retardant is one or a mixture of at least two selected from the group consisting of bromine-based flame retardant, phosphorus-based flame retardant or nitrogen-based flame retardant.

Preferably, the bromine-based flame retardant is one or a mixture of at least two selected from the group consisting of decabromodiphenyl ether, hexabromo benzene, decabromodiphenyl ethane and ethylene bis(tetrabromophthalimide). The mixture is selected from the group consisting of, e.g., a mixture of decabromodiphenyl ethane and hexabromo benzene, a mixture of decabromodiphenyl ether and ethylene bis(tetrabromophthalimide), a mixture of decabromodiphenyl ethane, hexabromo benzene and decabromodiphenyl ether, and a mixture of ethylene bis(tetrabromophthalimide), decabromodiphenyl ethane, hexabromo benzene and decabromodiphenyl ether.

Preferably, the phosphorus-based flame retardant is tris (2,4,6-trimethylphenyl)phosphine and/or 10-(2,5-dihydroxylphenyl)-9,10-dihydro-9-oxa-10-phosphaphenanthrene-10-oxide.

Preferably, the nitrogen-based flame retardant is one or a mixture of at least two selected from the group consisting of melamine, melamine phosphate, guanidine phosphate, guanidine carbonate or guanidine sulfamate. The mixture is selected from the group consisting of, e.g., a mixture of guanidine sulfamate and guanidine carbonate, a mixture of guanidine phosphate and melamine phosphate, a mixture of melamine and guanidine sulfamate, a mixture of guanidine carbonate, guanidine phosphate and melamine, a mixture of melamine phosphate, guanidine sulfamate, melamine and guanidine phosphate, preferably melamine or/and melamine phosphate.

Preferably, the resin composition of the present invention further comprises a powder filler. Preferably, the powder filler is one or a mixture of at least two selected from the group consisting of crystalline silica, amorphous silica, spherical silica, molten silica, titania, silicon carbide, glass fiber, alumina, aluminum nitride, boron nitride, barium titanate or strontium titanate. The mixture is selected from the group consisting of, e.g., a mixture of crystalline silica and amorphous silica, a mixture of spherical silica and titania, a mixture of silicon carbide and glass fiber, a mixture of alumina and aluminum nitride, a mixture of boron nitride and barium titanate, a mixture of strontium titanate and silicon carbide, and a mixture of spherical silica, crystalline silica, and amorphous silica.

In the resin composition of the present invention, the powder filler functions as increasing the size stability, decreasing the thermal expansion coefficient, and reducing the system cost. The present invention does not limit the shape and particle size of the powder filler. The particle size generally used is 0.2-10 μm, e.g., 0.5 μm, 1 μm, 2 μm, 3 μm, 5 μm, 8 μm or 9 μm. For example, spherical silica having a particle size of 0.2-10 μm may be selected.

The resin composition comprises, based on 100 parts by weight of the total weight of the methacrylate-modified polyphenylether resin and MQ organosilicon resin containing unsaturated double bonds and having a three-dimensional network structure and hydrolytically condensed from monofunctional siloxane unit (M unit) and tetrafunctional silica unit (Q unit), from 1-3 parts by weight of the radical initiator, and from 5 to 40 parts by weight of the flame retardant.

The radical initiator is present in an amount of, e.g., 1.2, 1.4, 1.6, 1.8, 2.0, 2.2, 2.4, 2.6, 2.8, or 2.9 parts by weight. The selection of the amount of the radical initiator in the present invention may achieve suitable reaction rate during the curing process, so as to obtain a better curing property during the curing reaction of the preparation of prepregs or high frequency circuit substrates.

The flame retardant is in an amount of, e.g., 5, 7, 11, 15, 19, 23, 27, 31, 35, 38, or 39 parts by weight. If the amount of the flame retardant is too high, the heat resistance and interstratified adhesive force will be decreased.

Based on 100 parts by weight of the total weight of the modified polyphenylether resin, MQ organosilicon resin containing unsaturated double bonds and having a three-dimensional network structure and hydrolytically condensed from monofunctional siloxane unit (M unit) and tetrafunctional silica unit (Q unit) and flame retardant, the powder filler is in an amount of from 10 to 150 parts by weight.

The powder filler is in an amount of, e.g., 10, 15, 25, 35, 45, 55, 75, 90, 100, 110, 120, 130, 140, or 145 parts by weight.

The wording "comprise(s)/comprising" in the present invention means that, besides said components, there may be other components which endow the resin composition with different properties.

For example, the resin composition of the present invention may be mixed with the other thermosetting resin, for example, epoxy resin, cyanate resin, novolac resin, polyurethane resin, melamine resin and the like. The curing agents or curing accelerants of these thermosetting resins may also be added.

In addition, the resin composition may comprise various additives, e.g., silane coupling agent, titanate coupling agent, antioxygen, heat stabilizer, antistatic agent, ultraviolet light absorber, pigments, colorants, lubricants and the like. These thermosetting resins and various additives may be used separately or in combination.

The process for preparing the resin composition of the present invention comprises, by common methods, matching, stirring, and mixing the methacrylate-modified polyphenylether resin, MQ organosilicon resin containing unsaturated double bonds and having a three-dimensional network structure and hydrolytically condensed from monofunctional siloxane unit (M unit) and tetrafunctional silica unit (Q unit), radical initiator, flame retardant and powder filler, and various thermosetting resins and additives.

The second objective of the present invention is to provide a resin varnish obtained by dissolving or dispersing the aforesaid resin composition in a solvent.

The solvent of the present invention is not specifically limited. The specific examples are alcohols such as methanol, ethanol, butanol and the like, ethers such as ethyl cellosolve, butyl cellosolve, ethylene glycol-methyl ether, carbitol, butyl carbitol and the like, ketones such as acetone, butanone, methyl isobutyl ketone, cyclohexanone and the like, aromatic hydrocarbons such as toluene, xylol, mesitylene and the like, esters such as 2-ethoxy ethyl acetate, ethyl acetate and the like, nitrogen-containing solvents, such as N,N-dimethylformamide, N,N-dimethylacetamide, N-methyl-2-pyrrolidone and the like. The solvents above may be used separately or in combination, preferably by mixing aromatic hydrocarbons such as toluene, xylol, mesitylene and the like with ketones such as acetone, butanone, methyl ethyl ketone, methyl isobutyl ketone, cyclohexanone and the like. The amount can be determined by those skilled in the art according to their experiences, so as to make the resultant resin varnish achieve suitable viscosity.

An emulsifier may be added when the aforesaid resin composition is dissolved or dispersed in the solvent. The powder filler may be homogeneously dispersed in the varnish by dispersing with an emulsifier.

The third objective of the present invention is to provide a prepreg obtained by impregnating a glass fiber cloth with the resin varnish above and drying.

In the present invention, the glass fiber cloth as a reinforcing material functions in the complex material as increasing the strength, increasing the size stability and decreasing the shrinkage of thermosetting resin during curing and the like. Different types of glass fiber cloth may be selected according to different requirements, e.g., sheet thickness. The exemplary glass fiber cloth is, e.g., 7628 glass fiber cloth or 2116 glass fiber cloth.

Based on 100 parts by weight of the total weight of the modified polyphenylether resin, MQ organosilicon resin containing unsaturated double bonds and having a three-dimensional network structure and hydrolytically condensed from monofunctional siloxane unit (M unit) and tetrafunctional silica unit (Q unit), flame retardant and powder filler, the glass fiber cloth is in an amount of from 50 to 230 parts by weight, e.g., 70, 90, 110, 150, 180, 200, 210 or 220 parts by weight.

The drying temperature is 80-220° C., e.g., 90° C., 110° C., 150° C., 170° C., 190° C., or 200° C. The drying lasts for 1-30 min, e.g., 5 min, 8 min, 13 min, 17 min, 21 min, 24 min or 28 min.

The fourth objective of the present invention is to provide a process for preparing high frequency circuit substrates, comprising overlapping at least one sheet of the above prepreg, placing copper foils at the top and bottom sides of the overlapped prepreg, and laminated molding.

Said overlapping is preferably carried out by automatic stacking, to make the technological operation simple and convenient.

The laminated molding is preferably vacuum laminated molding, which may be fulfilled by a vacuum laminating machine. The lamination lasts for 70-120 min, e.g., 75 min, 80 min, 85 min, 90 min, 95 min, 100 min, 105 min, 110 min or 115 min. The lamination is carried out at a temperature of 180-220° C., e.g., 185° C., 190° C., 195° C., 200° C., 205° C., 210° C. or 215° C., and at a pressure of 40-60 kg/cm$^2$, e.g., 45 kg/cm$^2$, 50 kg/cm$^2$, 55 kg/cm$^2$ or 58 kg/cm$^2$.

The fifth object of the present invention is to provide high frequency circuit substrates prepared according to the process above. By using the process of the present invention, high frequency circuit substrates having excellent dielectric properties and thermal resistance, low water absorption and high interstratified adhesive force and bending strength can be prepared.

The typical, but non-limitative process for preparing the high frequency circuit substrates of the present invention is stated as follows:

(1) Weighing the components according to the formula of the resin composition: from 10 to 90 parts by weight of MQ organosilicon resin containing unsaturated double bonds and having a three-dimensional network structure and hydrolytically condensed from monofunctional siloxane unit (M unit) and tetrafunctional silica unit (Q unit) based on 100 parts by weight of modified polyphenylether resin. Based on 100 parts by weight of the total weight of the modified polyphenyl ether resin and MQ organosilicon resin containing unsaturated double bonds and having a three-dimensional network structure and hydrolytically condensed from monofunctional siloxane unit (M unit) and tetrafunctional silica unit (Q unit), the radical initiator is in an amount of from 1 to 3 parts by weight; the flame retardant is in an amount of from 5 to 40 parts by weight; the powder filler is in an amount of from 10 to 150 parts by weight.

(2) The modified polyphenylether resin and MQ organosilicon resin containing unsaturated double bonds and having a three-dimensional network structure and hydrolytically condensed from monofunctional siloxane unit (M unit) and tetrafunctional silica unit (Q unit), radical initiator, powder filler and flame retardant are mixed, and a suitable amount of solvent is added to homogeneously stir to make the powder filler and flame retardant homogeneously dispersed in the resin varnish. A glass fiber cloth is impregnated with the varnish, and dried to remove the solvent to obtain a prepreg.

(3) Overlapping at least one sheet of the prepreg, placing copper foils on both sides of the prepreg, laminating and curing in a vacuum laminating machine to obtain a high frequency circuit substrate.

The "high frequency" in the present invention refers to a frequency higher than 1 MHz.

As compared with the prior art, the present invention has the following beneficial effects.

(1) Using MQ organosilicon resin containing unsaturated double bonds and having a three-dimensional network structure and hydrolytically condensed from monofunctional siloxane unit (M unit) and tetrafunctional silica unit (Q unit) as the crosslinking agent for the modified polyphenyl ether resins, wherein the cured resin composition has a great crosslinking density and may provide a high glass transition temperature of high frequency circuit substrates.

(2) The MQ organosilicon resin containing unsaturated double bonds and having a three-dimensional network structure and hydrolytically condensed from monofunctional siloxane unit (M unit) and tetrafunctional silica unit (Q unit) contains no polar group, which may ensure a low water absorption and excellent dielectric properties of high frequency circuit substrates.

(3) The MQ organosilicon resin containing unsaturated double bonds and having a three-dimensional network structure and hydrolytically condensed from monofunctional siloxane unit (M unit) and tetrafunctional silica unit (Q unit) has a high thermal decomposition temperature, which may provide excellent heat resistance for high frequency circuit substrates.

(4) The MQ organosilicon resin containing unsaturated double bonds and having a three-dimensional network structure and hydrolytically condensed from monofunctional siloxane unit (M unit) and tetrafunctional silica unit (Q unit) is used as the crosslinking agent for the modified polyphenylether resins, wherein the prepared high frequency circuit substrate has a high interstratified adhesive force and a high bending strength, so as to increase the reliability of the substrate.

(5) The MQ organosilicon resin containing unsaturated double bonds and having a three-dimensional network structure and hydrolytically condensed from monofunctional siloxane unit (M unit) and tetrafunctional silica unit (Q unit) does not evaporate, and thus there is no evaporation problem during the coating and drying process.

In conclusion, high frequency circuit substrate prepared from MQ organosilicon resin containing unsaturated double bonds and having a three-dimensional network structure and hydrolytically condensed from monofunctional siloxane unit (M unit) and tetrafunctional silica unit (Q unit) has a high glass transition temperature, better thermal resistance, a low water absorption, a high interstratified adhesive force and a high bending strength and excellent dielectric properties, and are very suitable for preparing circuit substrates of high frequency electronic equipments.

BRIEF DESCRIPTION OF THE FIGURES

The technical solutions of the present invention are further stated in combination with the figures and embodiments.

FIG. 1 shows a schematic diagram of one embodiment of the high frequency circuit substrate of the present invention.

The signs in the drawings of the present invention are stated as follows:

1 and 10 are copper foils, preferably high peel reverse copper foils, low-profile copper foils, ultra-low contour coppers foil.

2, 3, 4, 5, 6, 7, 8 and 9 represent prepregs, and there are 9 sheets of prepreg in this embodiment. In the actual use, the number of the prepreg sheets, the type of glass fiber cloth, the weight percent of the glass fiber cloth in the resin composition shall be determined by, e.g., the thickness of the high frequency circuit substrates required in the actual use.

EXAMPLES

Preparation Examples

Preparation Example 1

A mixed solution of hexavinyldisiloxane, concentrated hydrochloric acid, deionized water and ethanol was added into a three-neck flask. A machine mixer was started. Under the conditions of fast stirring and heating reflux, tetraethoxysilane was rapidly dripped to hydrolytically condense. After hydrolyzing for a certain time, toluene was added for extraction. Then the reaction solution was poured into a separating funnel, stood still for stratification. The water layer was removed, and the oil layer was washed with water to neutral, distilled and dried to remove the solvent toluene to obtain MQ resin SY-1 having a molecular weight Mn of 10,000.

Preparation Example 2

A mixed solution of divinyltetraphenyldisiloxane, concentrated hydrochloric acid, deionized water and ethanol was added into a three-neck flask. A machine mixer was started. Under the conditions of fast stirring and heating reflux, tetraethoxysilane was rapidly dripped to hydrolytically condense. After hydrolyzing for a certain time, toluene was added for extraction. Then the reaction solution was poured into a separating funnel, stood still for stratification. The water layer was removed, and the oil layer was washed with water to neutral, distilled and dried to remove the solvent toluene to obtain MQ resin SY-2 having a molecular weight Mn of 10,000.

In order to better explain the present invention and understand the technical solutions of the present invention, the typical but non-limitative examples are provided as follows.

Examples

Table 1 shows the raw materials used in the Examples and Comparison Examples.

TABLE 1

Raw materials used in Examples 1-3

| MANUFACTURERS | Product name or model | Description of the materials |
|---|---|---|
| Sabic | SA9000 | Methacrylate-modified polyphenylether resin, having a molecular weight Mn of 3,000. |
| Mitsubishi Chemical Corporation | St-PPE-1 | Styryl-modified polyphenylether resin, having a molecular weight Mn of 2,000. |
| Guangzhou Deerta Organosilicon Technology Development Co., Ltd | TD-2020 | MQ organosilicon resin containing unsaturated double bonds and having a three-dimensional network structure and hydrolytically condensed from monofunctional siloxane unit (M unit) and tetrafunctional silica unit (Q unit), wherein $Z_1$, $Z_2$ and $Z_3$ in DT-2020 are respectively vinyl, methyl and methyl, having a molecular weight Mn of 10,000. |
| Self-made | SY-1 | MQ organosilicon resin containing unsaturated double bonds and having a three-dimensional network structure and hydrolytically condensed from monofunctional siloxane unit (M unit) and tetrafunctional silica unit (Q unit), wherein $Z_1$, $Z_2$ and $Z_3$ in SY-1 are respectively vinyl, vinyl and vinyl, having a molecular weight Mn of 10,000. |
| Self-made | SY-2 | MQ organosilicon resin containing unsaturated double bonds and having a three-dimensional network structure and hydrolytically condensed from monofunctional siloxane unit (M unit) and tetrafunctional silica unit (Q unit), wherein $Z_1$, $Z_2$ and $Z_3$ in TD-2020 are respectively vinyl, phenyl and phenyl, having a molecular weight Mn of 10,000. |
| Runhe Chemical | RH-Vi306 | Linear organosilicon compound containing unsaturated double bonds |
| WD Silicone | WD-V4 | Annular organosilicon compound containing unsaturated double bonds |
| Shanghai Gaoqiao | DCP | Dicumyl peroxide |
| Dongguan Xinwei Chemical | BPO | Dibenzoyl peroxide |
| Sibelco | 525 | Molten silica |
| Bengbu Xinyuan | SJS-0020 | Spherical silica |
| Albemarle Corporation | BT-93W | Bromine-based flame retardant |
| Clariant | Exolit OP935 | Phosphorus-based flame retardant |
| Shanghai Grace | 2116 | Glass fiber cloth |

Example 1

90 parts by weight of methacrylate-modified polyphenylether resin powder SA9000, 10 parts by weight of MQ organosilicon resin DT-2020 containing unsaturated double bonds and having a three-dimensional network structure and hydrolytically condensed from monofunctional siloxane unit (M unit) and tetrafunctional silica unit (Q unit) and 1.0 part by weight of radical initiator dicumyl peroxide (DCP) were dissolved in toluene solvent and adjusted to a suitable viscosity. 2116 glass fabric was impregnated with the resin varnish and went through the clip shaft to control the piece weight, dried in an oven to remove the toluene solvent to obtain a 2116 prepreg. Four sheets of 2116 prepreg were overlapped, covered with copper foils having a thickness of 1 OZ at the top and bottom thereof, vacuum-laminated and cured for 90 min in a pressing machine, wherein the curing pressure was 50 kg/cm$^2$; and the curing temperature was 200° C., to prepare a high frequency circuit substrate. The overall performances of the substrate are shown in Table 2.

Example 2

80 parts by weight of methacrylate-modified polyphenylether resin powder SA9000, 20 parts by weight of MQ organosilicon resin DT-2020 containing unsaturated double bonds and having a three-dimensional network structure and hydrolytically condensed from monofunctional siloxane unit (M unit) and tetrafunctional silica unit (Q unit), 3.0 parts by weight of radical initiator DCP, 60 parts by weight of molten silica 525, 30 parts by weight of flame retardant BT-93W were mixed and dissolved in toluene solvent and adjusted to a suitable viscosity. An emulsifier was used to emulsify, so as to homogeneously disperse the powder filler and flame retardant in the mixed solution to obtain a resin varnish. 2116 glass fabric was impregnated with the resin varnish and went through the clip shaft to control the piece weight, dried in an oven to remove the toluene solvent to obtain a 2116 prepreg. 4 sheets of 2116 prepreg were overlapped, covered with copper foils having a thickness of 1 OZ at the top and bottom thereof, vacuum-laminated and cured for 90 min in a pressing machine, wherein the curing pressure was 50 kg/cm$^2$; and the curing temperature was 200° C., to prepare a high frequency circuit substrate. The overall performances of the substrate are shown in Table 2.

Example 3

70 parts by weight of methacrylate-modified polyphenylether resin powder SA9000, 30 parts by weight of MQ organosilicon resin DT-2020 containing unsaturated double bonds and having a three-dimensional network structure and hydrolytically condensed from monofunctional siloxane unit (M unit) and tetrafunctional silica unit (Q unit), 3.0 parts by weight of radical initiator benzoyl peroxide (BPO), 170 parts by weight of spherical silica SJS-0020, 15 parts by weight of flame retardant Exolit OP935 were mixed and dissolved in toluene solvent and adjusted to a suitable viscosity. An emulsifier was used to emulsify, so as to homogeneously disperse the powder filler and flame retardant in the mixed solution to obtain a resin varnish. 2116 glass fabric was impregnated with the resin varnish and went through the clip shaft to control the piece weight, dried in an oven to remove the toluene solvent to obtain a 2116 prepreg. Four sheets of 2116 prepreg were overlapped, covered with copper foils having a thickness of 1 OZ at the top and bottom thereof, vacuum-laminated and cured for 90 min in a pressing machine, wherein the curing pressure was 50 kg/cm$^2$; and the curing temperature was 200° C., to prepare a high frequency circuit substrate. The overall performances of the substrate are shown in Table 2.

Example 4

90 parts by weight of styryl-modified polyphenylether resin powder St-PPE-1, 10 parts by weight of MQ organosilicon resin DT-2020 containing unsaturated double bonds and having a three-dimensional network structure and hydrolytically condensed from monofunctional siloxane unit (M unit) and tetrafunctional silica unit (Q unit) and 1.0 part by weight of radical initiator dicumyl peroxide (DCP) were dissolved in toluene solvent and adjusted to a suitable viscosity. 2116 glass fabric was impregnated with the resin varnish and went through the clip shaft to control the piece weight, dried in an oven to remove the toluene solvent to obtain a 2116 prepreg. 4 sheets of 2116 prepreg were overlapped, covered with copper foils having a thickness of 1 OZ at the top and bottom thereof, vacuum-laminated and cured for 90 min in a pressing machine, wherein the curing pressure was 50 kg/cm$^2$; and the curing temperature was 200° C., to prepare a high frequency circuit substrate. The overall performances of the substrate are shown in Table 2.

Example 5

80 parts by weight of styryl-modified polyphenylether resin powder St-PPE-1, 20 parts by weight of MQ organosilicon resin DT-2020 containing unsaturated double bonds and having a three-dimensional network structure and hydrolytically condensed from monofunctional siloxane unit (M unit) and tetrafunctional silica unit (Q unit), 3.0 parts by weight of radical initiator DCP, 60 parts by weight of molten silica 525, 30 parts by weight of flame retardant BT-93W were mixed and dissolved in toluene solvent and adjusted to a suitable viscosity. An emulsifier was used to emulsify, so as to homogeneously disperse the powder filler and flame retardant in the mixed solution to obtain a resin varnish. 2116 glass fabric was impregnated with the resin varnish and went through the clip shaft to control the piece weight, dried in an oven to remove the toluene solvent to obtain a 2116 prepreg. 4 sheets of 2116 prepreg were overlapped, covered with copper foils having a thickness of 1 OZ at the top and bottom thereof, vacuum-laminated and cured for 90 min in a pressing machine, wherein the curing pressure was 50 kg/cm$^2$; and the curing temperature was 200° C., to prepare a high frequency circuit substrate. The overall performances of the substrate are shown in Table 2.

Example 6

80 parts by weight of methacrylate-modified polyphenylether resin powder SA9000, 20 parts by weight of MQ organosilicon resin SY-1 containing unsaturated double bonds and having a three-dimensional network structure and hydrolytically condensed from monofunctional siloxane unit (M unit) and tetrafunctional silica unit (Q unit), 3.0 parts by weight of radical initiator DCP, 60 parts by weight of molten silica 525, 30 parts by weight of flame retardant BT-93W were mixed and dissolved in toluene solvent and adjusted to a suitable viscosity. An emulsifier was used to emulsify, so as to homogeneously disperse the powder filler and flame retardant in the mixed solution to obtain a resin varnish. 2116 glass fabric was impregnated with the resin varnish and went through the clip shaft to control the piece weight, dried in an oven to remove the toluene solvent to obtain a 2116 prepreg. 4 sheets of 2116 prepreg were overlapped, covered with copper foils having a thickness of 1 OZ at the top and bottom thereof, vacuum-laminated and cured for 90 min in a pressing machine, wherein the curing pressure was 50 kg/cm$^2$; and the curing temperature was 200° C., to prepare a high frequency circuit substrate. The overall performances of the substrate are shown in Table 2.

Example 7

80 parts by weight of methacrylate-modified polyphenylether resin powder SA9000, 20 parts by weight of MQ organosilicon resin SY-2 containing unsaturated double bonds and having a three-dimensional network structure and hydrolytically condensed from monofunctional siloxane unit (M unit) and tetrafunctional silica unit (Q unit), 3.0 parts by weight of radical initiator DCP, 60 parts by weight of molten silica 525, 30 parts by weight of flame retardant BT-93W were mixed and dissolved in toluene solvent and adjusted to a suitable viscosity. An emulsifier was used to emulsify, so as to homogeneously disperse the powder filler and flame retardant in the mixed solution to obtain a resin varnish. 2116 glass fabric was impregnated with the resin varnish and went through the clip shaft to control the piece weight, dried in an oven to remove the toluene solvent to obtain a 2116 prepreg. Four sheets of 2116 prepreg were overlapped, covered with copper foils having a thickness of 1 OZ at the top and bottom thereof, vacuum-laminated and cured for 90 min in a pressing machine, wherein the curing pressure was 50 kg/cm$^2$; and the curing temperature was 200° C., to prepare a high frequency circuit substrate. The overall performances of the substrate are shown in Table 2.

Comparison Example 1

The MQ organosilicon resin containing unsaturated double bonds and having a three-dimensional network structure and hydrolytically condensed from monofunctional siloxane unit (M unit) and tetrafunctional silica unit (Q unit) in Example 2 was replaced with linear organosilicon compound RH-Vi306 containing unsaturated double bonds, and the others are the same as Example 2. Table 2 shows the components in Examples 1-7 and Comparison Examples 1-2 and the performance test results.

Comparison Example 2

The MQ organosilicon resin containing unsaturated double bonds and having a three-dimensional network structure and hydrolytically condensed from monofunctional siloxane unit (M unit) and tetrafunctional silica unit (Q unit) in Example 2 was replaced with annular organosilicon compound WD-V4 containing unsaturated double bonds, and the others are the same as Example 2. Table 2 shows the components in Examples 1-7 and Comparison Examples 1-2 and the performance test results.

TABLE 2

| Raw materials and performances | Example 1 | Example 2 | Example 3 | Example 4 | Example 5 | Example 6 | Example 7 | Comparison Example 1 | Comparison Example 2 |
|---|---|---|---|---|---|---|---|---|---|
| SA9000 | 90 | 80 | 70 | 0 | 0 | 80 | 80 | 80 | 80 |
| St-PPE-1 | 0 | 0 | 0 | 90 | 80 | 0 | 0 | 0 | 0 |
| TD-2020 | 10 | 20 | 30 | 10 | 20 | 0 | 0 | 0 | 0 |
| RH-Vi306 | 0 | 0 | 0 | 0 | 0 | 0 | 0 | 20 | 0 |
| WD-V4 | 0 | 0 | 0 | 0 | 0 | 0 | 0 | 0 | 20 |
| SY-1 | 0 | 0 | 0 | 0 | 0 | 20 | 0 | 0 | 0 |
| SY-2 | 0 | 0 | 0 | 0 | 0 | 0 | 20 | 0 | 0 |
| DCP | 1 | 3 | 0 | 1 | 3 | 3 | 3 | 3 | 3 |
| BPO | 0 | 0 | 3 | 0 | 0 | 0 | 0 | 0 | 0 |
| 525 | 0 | 60 | 0 | 0 | 60 | 60 | 60 | 60 | 60 |
| SJS-0020 | 0 | 0 | 170 | 0 | 0 | 0 | 0 | 0 | 0 |
| BT-93W | 0 | 30 | 0 | 0 | 30 | 30 | 30 | 30 | 30 |
| Exolit OP935 | 0 | 0 | 15 | 0 | 0 | 0 | 0 | 0 | 0 |
| 2116 | 80 | 155 | 230 | 80 | 155 | 155 | 155 | 155 | 155 |
| Resin compatibility | worse | worse | worse | worse | worse | worse | worse | worse | worse |
| Glass transition temperature (° C.) | 205.0 | 208.4 | 213.2 | 210.5 | 215.6 | 231.8 | 210.0 | 198.2 | 215.0 |
| Thermal decomposition temperature (° C.) | 468.0 | 435.3 | 458.5 | 469.1 | 438.7 | 440.6 | 437.2 | 421.7 | 424.1 |
| Dip soldering resistance 288° C. (s) | >300 | >300 | >300 | >300 | >300 | >300 | >300 | >300 | >300 |
| Water absorption | 0.08 | 0.08 | 0.08 | 0.07 | 0.07 | 0.08 | 0.08 | 0.08 | 0.08 |
| Interstratified adhesive force | 1.06-2.21 | 1.95-2.56 | 1.73-1.98 | 1.45-1.95 | 1.23-1.89 | 2.75-3.59 | 2.14-2.64 | 1.44-1.61 | 1.62-2.56 |
| Bending strength (Mpa) | 456 | 486 | 493 | 451 | 476 | 492 | 479 | 359 | 421 |
| Dielectric constant (10 GHz) | 3.64 | 3.75 | 4.13 | 3.63 | 3.60 | 3.80 | 3.78 | 4.03 | 3.71 |
| Dielectric loss tangent (10 GHz) | 0.0078 | 0.0075 | 0.0073 | 0.0062 | 0.0060 | 0.0071 | 0.0073 | 0.0075 | 0.0072 |

It can be seen according to the data in Table 2 that, as compared to linear organosilicon compound RH-Vi306 containing unsaturated double bonds, the high frequency circuit substrates obtained by using MQ organosilicon resin DT-2020 containing unsaturated double bonds and having a three-dimensional network structure and hydrolytically condensed from monofunctional siloxane unit (M unit) and tetrafunctional silica unit (Q unit) as the crosslinking agent have higher bending strength. As compared to annular organosilicon compound WD-V4 containing unsaturated double bonds, MQ organosilicon resin DT-2020 containing unsaturated double bonds and having a three-dimensional network structure and hydrolytically condensed from monofunctional siloxane unit (M unit) and tetrafunctional silica unit (Q unit) as the crosslinking agent will not evaporate during the coating and drying process. The high frequency circuit substrates obtained by using MQ organosilicon resin DT-2020 containing unsaturated double bonds and having a three-dimensional network structure and hydrolytically condensed from monofunctional siloxane unit (M unit) and tetrafunctional silica unit (Q unit) as the crosslinking agent have a high glass transition temperature, a high thermal decomposition temperature, a low water absorption, a high interstratified adhesive force, a high bending strength and excellent dielectric properties. Thus MQ organosilicon resin containing unsaturated double bonds and having a three-dimensional network structure and hydrolytically condensed from monofunctional siloxane unit (M unit) and tetrafunctional silica unit (Q unit) is a crosslinking agent having excellent overall performances, and can be used for preparing high frequency circuit substrates.

Additionally, it can be seen according to Table 2 that, relative to MQ resin crosslinking agent DT-2020, the substrates using SY-1 to crosslink SA9000, have a higher glass transition temperature, which shows that increasing the ethylene content of MQ may increase the crosslinking density of the substrate. As compared to MQ resin crosslinking agent DT-2020, SY-2 crosslinks SA9000, and has better compatibility to SA9000, which shows that the MQ resin having a benzene ring structure may increase the compatibility to the resins containing benzene ring structures.

Example 8

70 parts by weight of methacrylate-modified polyphenylether resin, 30 parts by weight of MQ organosilicon resin DT-2020 containing unsaturated double bonds and having a three-dimensional network structure and hydrolytically condensed from monofunctional siloxane unit (M unit) and tetrafunctional silica unit (Q unit), 2 parts by weight of radical initiator n-butyl 4,4-bis(tert-butyl peroxy) valerate, 98 parts by weight of silicon carbide, and 40 parts by weight of flame retardant tri(2,6-dimethylphenyl)phosphine were dissolved in a mixed solvent of toluene and butanone and adjusted to a suitable viscosity to obtain a resin varnish. 119 parts by weight of 7628 glass fabric was impregnated with the resin varnish and went through the clip shaft to control the piece weight, dried in an oven to remove the toluene solvent to obtain a 7628 prepreg. 4 sheets of 7628 prepreg were overlapped, covered with copper foils having a thickness of 1 OZ at the top and bottom thereof, vacuum-laminated and cured for 90 min in a pressing machine, wherein the curing pressure was 50 kg/cm², and the curing temperature was 200° C., to prepare a high frequency circuit substrate.

The methacrylate-modified polyphenylether resin has the following structural formula:

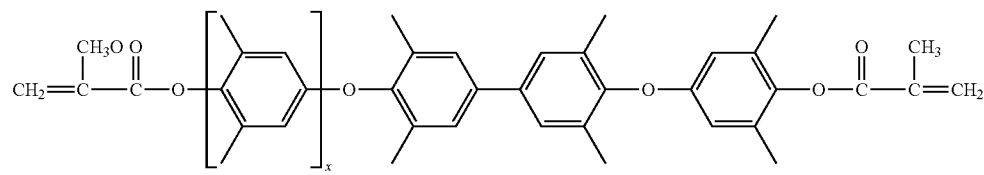

wherein 15<x<50; 15<y<50; 15<x+y<100; and the methacrylate-modified polyphenylether resin has a molecular weight of 10,000 g/mol.

Example 9

60 parts by weight of methacrylate-modified polyphenylether resin, 40 parts by weight of MQ organosilicon resin DT-2020 containing unsaturated double bonds and having a three-dimensional network structure and hydrolytically condensed from monofunctional siloxane unit (M unit) and tetrafunctional silica unit (Q unit), 1.5 parts by weight of radical initiator dibenzoyl peroxide, 125 parts by weight of aluminum nitride and 25 parts by weight of decabromodiphenyl ether were dissolved in a toluene solvent and adjusted to a suitable viscosity. An emulsifier was used to emulsify, so as to homogeneously disperse the powder filler and flame retardant in the mixed solution to obtain a resin varnish. 575 parts by weight of 2116 glass fabric was impregnated with the resin varnish and went through the clip shaft to control the piece weight, dried in an oven to remove the toluene solvent to obtain a 2116 prepreg. Four sheets of 2116 prepreg were overlapped, covered with copper foils having a thickness of 1 OZ at the top and bottom thereof, vacuum-laminated and cured for 90 min in a pressing machine, wherein the curing pressure was 50 kg/cm²; and the curing temperature was 200° C., to prepare a high frequency circuit substrate.

The methacrylate-modified polyphenylether resin has the following structural formula:

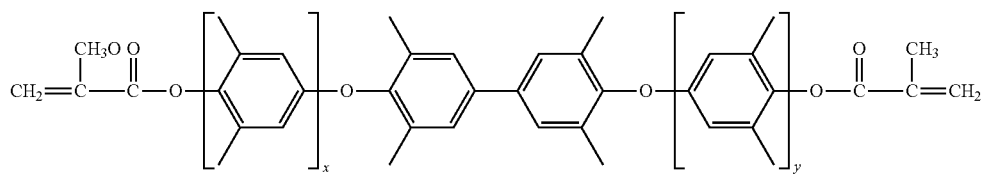

wherein 50<x<100; the methacrylate-modified polyphenylether resin has a molecular weight of 8,000 g/mol.

Example 10

50 parts by weight of styryl-modified polyphenylether resin, 50 parts by weight of MQ organosilicon resin DT-2020 containing unsaturated double bonds and having a three-dimensional network structure and hydrolytically condensed from monofunctional siloxane unit (M unit) and tetrafunctional silica unit (Q unit), 1 part by weight of radical initiator dibenzoyl peroxide, 100 parts by weight of alumina and 30 parts by weight of decabromodiphenyl ether were mixed and dissolved in a toluene solvent and adjusted to a suitable viscosity. An emulsifier was used to emulsify, so as to homogeneously disperse the powder filler and flame retardant in the mixed solution to obtain a resin varnish. 230 parts by weight of 2116 glass fabric was impregnated with the resin varnish and went through the clip shaft to control the piece weight, dried in an oven to remove the toluene solvent to obtain a 2116 prepreg. Four sheets of 2116 prepreg were overlapped, covered with copper foils having a thickness of 1 OZ at the top and bottom thereof, vacuum-laminated and cured for 120 min in a pressing machine, wherein the curing pressure was 40 kg/cm²; and the curing temperature was 180° C., to prepare a high frequency circuit substrate.

The styryl-modified polyphenylether resin has the structural formula:

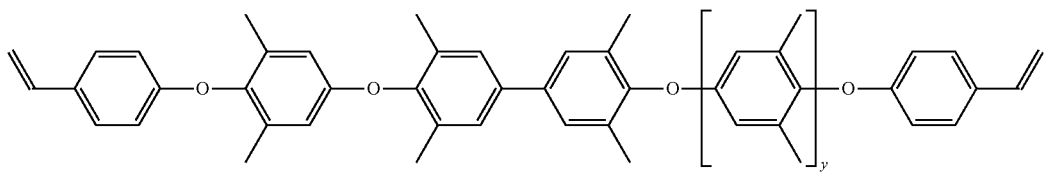

wherein 5<y<15, and the styryl-modified polyphenylether resin has a molecular weight of 1,000 g/mol.

Example 11

60 parts by weight of styryl-modified polyphenylether resin, 40 parts by weight of MQ organosilicon resin DT-2020 containing unsaturated double bonds and having a three-dimensional network structure and hydrolytically condensed from monofunctional siloxane unit (M unit) and tetrafunctional silica unit (Q unit), 1.5 parts by weight of radical initiator dibenzoyl peroxide, 125 parts by weight of boron nitride and 25 parts by weight of decabromodiphenyl ether were dissolved in a toluene solvent and adjusted to a suitable viscosity to obtain a resin varnish. An emulsifier was used to emulsify, so as to homogeneously disperse the powder filler and flame retardant in the mixed solution to obtain a resin varnish. 450 parts by weight of 2116 glass fabric was impregnated with the resin varnish and went through the clip shaft to control the piece weight, dried in an oven to remove the toluene solvent to obtain a 2116 prepreg. Four sheets of 2116 prepreg were overlapped, covered with copper foils having a thickness of 1 OZ at the top and bottom thereof, vacuum-laminated and cured for 70 min in a pressing machine, wherein the curing pressure was 60 kg/cm$^2$; and the curing temperature was 220° C., to prepare a high frequency circuit substrate.

The styryl-modified polyphenylether resin has the structural formula:

Wherein 50<x<60; 25<y<45; 75<x+y<100, and the styryl-modified polyphenylether resin has a molecular weight of 9,500 g/mol.

Example 12

70 parts by weight of methacrylate-modified polyphenylether resin, 30 parts by weight of MQ organosilicon resin SY-1 containing unsaturated double bonds and having a three-dimensional network structure and hydrolytically condensed from monofunctional siloxane unit (M unit) and tetrafunctional silica unit (Q unit), 2 parts by weight of radical initiator n-butyl 4,4-bis(tert-butyl peroxy) valerate, 98 parts by weight of silicon carbide, and 40 parts by weight of flame retardant tri(2,6-dimethylphenyl)phosphine were mixed and dissolved in a mixed solvent of toluene and butanone and adjusted to a suitable viscosity to obtain a resin varnish. 119 parts by weight of 7628 glass fabric was impregnated with the resin varnish and went through the clip shaft to control the piece weight, dried in an oven to remove the toluene solvent to obtain a 7628 prepreg. Four sheets of 7628 prepreg were overlapped, covered with copper foils having a thickness of 1 OZ at the top and bottom thereof, vacuum-laminated and cured for 90 min in a pressing machine, wherein the curing pressure was 50 kg/cm$^2$; and the curing temperature was 200° C., to prepare a high frequency circuit substrate.

The methacrylate-modified polyphenylether resin has the structural formula:

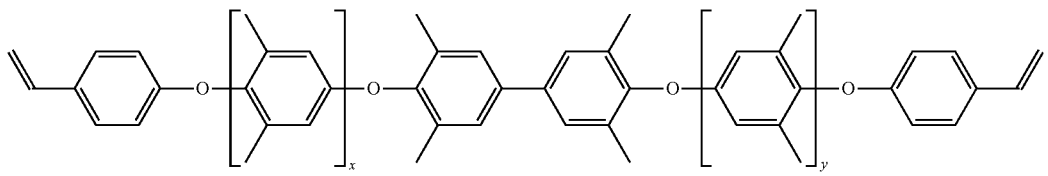

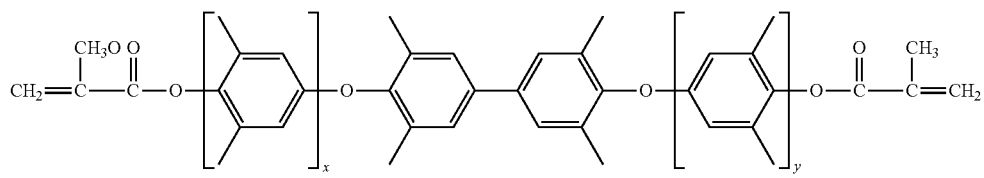

wherein 15<x<50; 15<y<50; 15<x+y<100, and the methacrylate-modified polyphenylether has a molecular weight of 10,000 g/mol.

Example 13

60 parts by weight of methacrylate-modified polyphenylether resin, 40 parts by weight of MQ organosilicon resin SY-2 containing unsaturated double bonds and having a three-dimensional network structure and hydrolytically condensed from monofunctional siloxane unit (M unit) and tetrafunctional silica unit (Q unit), 1.5 parts by weight of radical initiator dibenzoyl peroxide, 125 parts by weight of aluminum nitride, and 25 parts by weight of decabromodiphenyl ether were mixed and dissolved in toluene solvent and adjusted to a suitable viscosity. An emulsifier was used to emulsify, so as to homogeneously disperse the powder filler and flame retardant in the mixed solution to obtain a resin varnish. 575 parts by weight of 2116 glass fabric was impregnated with the resin varnish and went through the clip shaft to control the piece weight, dried in an oven to remove the toluene solvent to obtain a 2116 prepreg. Four sheets of 2116 prepreg were overlapped, covered with copper foils having a thickness of 1 OZ at the top and bottom thereof, vacuum-laminated and cured for 90 min in a pressing machine, wherein the curing pressure was 50 kg/cm$^2$; and the curing temperature was 200° C., to prepare a high frequency circuit substrate. The methacrylate-modified polyphenylether resin has the structural formula:

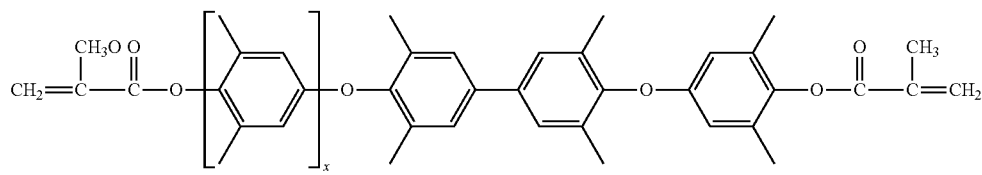

wherein 50<x<100, and the methacrylate-modified polyphenylether has a molecular weight of 8,000 g/mol.

Table 3 shows the test results of the high frequency circuit substrate performances in Examples 8-13

TABLE 3

| Performances | Example 8 | Example 9 | Example 10 | Example 11 | Example 12 | Example 13 |
|---|---|---|---|---|---|---|
| Glass transition temperature (° C.) | 198.4 | 201.3 | 215.2 | 206.9 | 221.7 | 201.5 |
| Thermal decomposition temperature (° C.) | 449.1 | 453.3 | 459.4 | 453.8 | 456.7 | 459.1 |
| Dip soldering resistance 288° C. (s) | >300 | >300 | >300 | >300 | >300 | >300 |
| Water absorption | 0.08 | 0.08 | 0.08 | 0.08 | 0.08 | 0.08 |
| Interstratified adhesive force | 1.56-2.23 | 1.31-2.41 | 1.27-2.62 | 1.44-1.61 | 2.56-2.89 | 1.52-2.68 |
| Bending strength (Mpa) | 484 | 471 | 460 | 478 | 492 | 481 |
| Dielectric constant (10 GHz) | 3.85 | 3.76 | 4.08 | 3.63 | 3.80 | 3.75 |
| Dielectric loss tangent (10 GHz) | 0.0086 | 0.0073 | 0.0069 | 0.0070 | 0.0080 | 0.0074 |

The applicant declares that, the present invention thoroughly discloses the process of the present invention by the aforesaid examples, but the present invention is not limited by the detailed process, i.e., it does not mean that the present invention cannot be fulfilled unless the aforesaid detailed process is used. Those skilled in the art shall know that, any amendment, equivalent change to the product materials of the present invention, addition of auxiliary ingredients, and selection of any specific modes all fall within the protection scope and disclosure scope of the present invention.

The invention claimed is:

1. A resin composition wherein the resin composition comprises an unsaturated thermosetting modified polyphenylether resin and an MQ organosilicon resin containing unsaturated double bonds and having a three-dimensional network structure and hydrolytically condensed from monofunctional siloxane unit (M unit) and tetrafunctional silica unit (Q unit).

2. The resin composition according to claim 1, wherein the modified polyphenylether resin has the following structure,

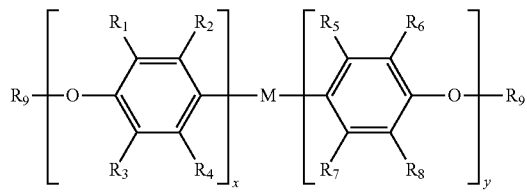

wherein 1≤x≤100; 1≤y≤100; 2≤x+y≤100; and M is selected from the group consisting of:

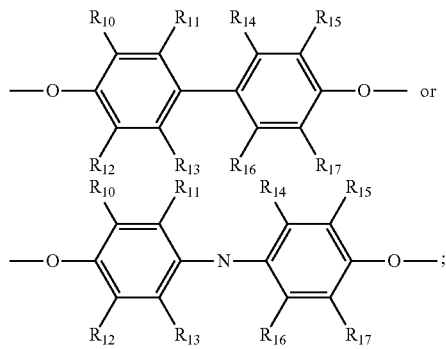

wherein N is any one selected from the group consisting of —O—, —CO—, SO, —SC—, —SO$_2$— and —C(CH$_3$)$_2$—; R$_2$, R$_4$, R$_6$, R$_8$, R$_{11}$, R$_{13}$, R$_{15}$ and R$_{17}$ are each independently selected from the group consisting of: substituted or unsubstituted C1-C8 linear chain alkyl group, substituted or unsubstituted C1-C8 branched chain alkyl group and substituted or unsubstituted phenyl; R$_1$, R$_3$, R$_5$, R$_7$, R$_{10}$, R$_{12}$, R$_{14}$ and R$_{16}$ are all any one independently selected from the group consisting of hydrogen atom, substituted or unsubstituted C1-C8 linear chain alkyl group, substituted or unsubstituted C1-C8 branched chain alkyl group and substituted or unsubstituted phenyl; R$_9$ is selected from the group consisting of:

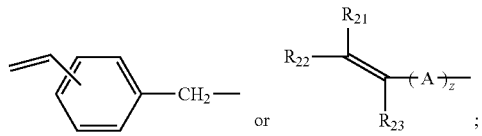

wherein A is selected from the group consisting of arylene, carbonyl, or alkylene having 1-10 carbon atoms; Z is an integer from 0-10; R$_{21}$, R$_{22}$ and R$_{23}$ are all independently a hydrogen atom or alkyl having 1-10 carbon atoms.

3. The resin composition according to claim 1 wherein the modified polyphenylether resin has a number-average molecular weight of about 500-10,000 g/mol.

4. The resin composition according to claim 1, wherein MQ organosilicon resin containing unsaturated double bonds and having a three-dimensional network structure and hydrolytically condensed from monofunctional siloxane unit (M unit) and tetrafunctional silica unit (Q unit) is a compound represented by the following general formula:

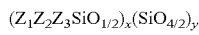

$(Z_1Z_2Z_3SiO_{1/2})_x(SiO_{4/2})_y$ wherein 1≤x≤100; 1≤y≤100; 2≤x+y≤200; and 0.01≤x/y≤10; at least one of Z$_1$, Z$_2$ and Z$_3$ is a group containing unsaturated double bond, and the other two are independently selected from the group consisting of: substituted or unsubstituted C1-C8 linear chain alkyl group, substituted or unsubstituted C1-C8 branched chain alkyl group and substituted or unsubstituted phenyl.

5. The resin composition according to claim 1, wherein the resin composition further comprises a radical initiator.

6. The resin composition according to claim 5, wherein the radical initiator is selected from organic peroxide initiator.

7. The resin composition according to claim 6, wherein the organic peroxide initiator is any one or a mixture of at least two selected from the group consisting of dicumyl peroxide, dibenzoyl peroxide, tert-butyl peroxybenzoate, and n-butyl 4,4-bis(tert-butyl peroxy)-valerate.

8. The resin composition according to claim 1, wherein the resin composition further comprises a flame retardant.

9. The resin composition according to claim 8, wherein flame retardant is one or a mixture of at least two selected from the group consisting of a bromine-based flame retardant, a phosphorus-based flame retardant and a nitrogen-based flame retardant.

10. The resin composition according to claim 9, wherein the bromine-based flame retardant is one or a mixture of at least two selected from the group consisting of decabromodiphenyl ether, hexabromo benzene, decabromodiphenyl ethane and ethylene bis(tetrabromophthalimide).

11. The resin composition according to claim 9, wherein the phosphorus-based flame retardant is tris(2,4,6-trimethylphenyl)phosphine and/or 10-(2,5-dihydroxylphenyl)-9,10-dihydro-9-oxa-10-phosphaphenanthrene-10-oxide.

12. The resin composition according to claim 9, wherein the nitrogen-based flame retardant is one or a mixture of at least two selected from the group consisting of melamine, melamine phosphate, guanidine phosphate, guanidine carbonate or guanidine sulfamate.

13. The resin composition according to claim 1, wherein the resin composition further comprises a powder filler.

14. The resin composition according to claim 13, characterized in that the powder filler is one or a mixture of at least two selected from the group consisting of crystalline silica, amorphous silica, spherical silica, molten silica, titania, silicon carbide, glass fiber, alumina, aluminum nitride, boron nitride, barium titanate or strontium titanate.

15. The resin composition according to claim 1, wherein the resin composition comprises from about 10 to about 100 parts by weight of MQ organosilicon resin containing unsaturated double bonds and having a three-dimensional network structure and hydrolytically condensed from monofunctional siloxane unit (M unit) and tetrafunctional silica unit (Q unit), based on 100 parts by weight of the modified polyphenylether resin.

16. The resin composition according to claim 15, wherein the resin composition comprises from about 1 to about 3 parts by weight of a radical initiator and from about 5 to about 40 parts by weight of a flame retardant, based on 100 parts by weight of the total weight of the modified polyphenylether resin and MQ organosilicon resin containing unsaturated double bonds and having a three-dimensional network structure and hydrolytically condensed from monofunctional siloxane unit (M unit) and tetrafunctional silica unit (Q unit).

17. The resin composition according to claim 16, wherein the resin composition comprises from about 10 to about 150 parts by weight of a powder filler, based on 100 parts by weight of the total weight of the modified polyphenylether resin and MQ organosilicon resin containing unsaturated double bonds and having a three-dimensional network structure and hydrolytically condensed from monofunctional siloxane unit (M unit) and tetrafunctional silica unit (Q unit).

18. A resin varnish, characterized in that the resin varnish is obtained by dissolving or dispersing the resin composition according claim 1 in a solvent.

19. A prepreg, wherein the prepreg is obtained by impregnating a glass fiber cloth with the resin varnish in claim 18 and drying.

20. The prepreg according to claim 19, wherein the prepreg comprises from about 50 to about 230 parts by weight of a glass fiber cloth, based on 100 parts by weight of the total weight of the modified polyphenylether resin, MQ organosilicon resin containing unsaturated double bonds and having a three-dimensional network structure and hydrolytically condensed from monofunctional siloxane unit (M unit) and tetrafunctional silica unit (Q unit), flame retardant and powder filler.

* * * * *